United States Patent [19]
Madjerec

[11] Patent Number: 5,549,925
[45] Date of Patent: Aug. 27, 1996

[54] HYBRID MICROCIRCUIT GLASS-TO-METAL SEAL REPAIR PROCESS

[75] Inventor: Michael T. Madjerec, Tucson, Ariz.

[73] Assignee: Hughes Missile Systems Company, Los Angeles, Calif.

[21] Appl. No.: 487,736

[22] Filed: Jun. 7, 1995

[51] Int. Cl.$^6$ .............................. B05D 3/02; B32B 35/00
[52] U.S. Cl. .................. 427/8; 427/96; 427/140; 427/287; 427/294; 427/385.5; 427/387; 427/393.6
[58] Field of Search .............................. 427/8, 140, 294, 427/287, 96, 385.5, 387, 393.6

[56] References Cited

U.S. PATENT DOCUMENTS

| | | | |
|---|---|---|---|
| 4,681,520 | 7/1987 | Birkhauser | 427/140 |
| 4,708,889 | 11/1987 | Hammond et al. | 427/140 |
| 5,221,388 | 6/1993 | Haubs et al. | 427/140 |

*Primary Examiner*—Janyce Bell
*Attorney, Agent, or Firm*—Charles D. Brown; Randall M. Heald; Wanda K. Denson-Low

[57] ABSTRACT

A process for repairing leaking glass-to-metal seals of a hybrid microcircuit header. The process comprises the following steps. A leaking hybrid microcircuit header is delidded (has its lid removed). The leaking hybrid microcircuit header, generally with its leads pointing vertically, is disposed on a vacuum source. A vacuum is formed on the hybrid microcircuit header using the vacuum source. A stream of helium is flowed over the seals to verify the presence of leaks in the seals of the hybrid microcircuit header. A small amount of high vacuum sealant is applied to each of the leaking glass-to-metal seals while the hybrid microcircuit header is exposed to the vacuum. The vacuum draws the sealant through the cracked or defective glass-to-metal seals. The high vacuum sealant generally comprises a silicone resin having a low vapor pressure. A stream of helium is caused to flow over the resealed leads following application of the high vacuum sealant to confirm that the hybrid microcircuit header is sealed. The hybrid microcircuit header is removed 27 from the vacuum source. The hybrid microcircuit header is then cured at a temperature of 150±10 degrees Celsius for a minimum of 2 hours to complete the repair process 20. The lid is reattached (seam sealed) following repairs. A final leak test is performed after reattachment of the lid.

7 Claims, 2 Drawing Sheets

HYBRID MICROCIRCUIT GLASS-TO-METAL SEAL REPAIR PROCESS

BACKGROUND

The present invention relates to hybrid microcircuits, and more particularly, to a glass-to-metal seal repair process for use with in repairing hybrid microcircuit headers having leaking seals.

Heretofore there has been no approved method for repairing leaking glass-to-metal seals of hybrid microcircuits used on Government programs, that insures their reliability once they are placed in operation. When leaks are encountered, two options have typically been available. The most common option is to scrap the hybrid microcircuit. The second option is to shear the ceramic substrate from its faulty header and rebond it into a new header. The header is the portion of the microcircuit containing the glass-to-metal seals. However, this process is very labor intensive and is operator dependent.. This method of repair often results in scrap caused by damaged substrates during the shearing process.

The following patents generally relate to methods or apparatus for repairing glass seals or encapsulates for hybrid microcircuits where silicon resins are applied to the leaks in the glass seals in a vacuum environment. Japanese 66-44742 assigned to Hitachi Ltd. discloses that in a vacuum chamber, a thin film of disilane is deposited at a localized defect in a circuit. U.S. Pat. No. 4,466,992 issued to Dreiling discloses that in a vacuum chamber, pinhole defects in a substrate semiconductor film are filled with heated silane or silicon compounds, and at column 3, lines 6–9 it is disclosed that substrates such as quartz, glass, and transparent polymeric materials can be repaired.

U.S. Pat. No. 4,508,758 issued to Wong discloses that in manufacturing encapsulated hybrid circuits, a first compound (RTV silicon) is used to form a wall around the periphery of each circuit and second encapsulate (polydimethyl siloxane) is flow coated over the the circuit within the wall formed by the first compound. In column 4, lines 10–15 it is disclosed that the encapsulate may be applied by hand or by use of a syringe. U.S. Pat. No. 4,708,889 issued to Hammond discloses that liquid silicates that are liquid at temperatures below the melting point of glass are used to repair glass and ceramic seals.

U.S. Pat. No. 5,156,853 issued to Werner discloses that windshield cracks may be repaired by applying a vacuum to the region adjacent to the crack and filling the crack with a liquid resin. U.S. Pat. No. 5,302,237 issued to Larson discloses that a plasma vacuum unit may be used for localized etching or depositions.

However, none of the above-cited patents disclose a glass-to-metal seal repair process for use with hybrid microcircuits as is provided for in the present invention.

Therefore, it is an objective of the present invention to provide for an improved glass-to-metal seal repair process for use with hybrid microcircuits having leaking seals.

SUMMARY OF THE INVENTION

In order to meet the above and other objectives, the present invention is a repair process for sealing leaking glass-to-metal seals of hybrid microcircuits found during fine and gross leak hermeticity testing. The present sealing process incorporates the use of a high vacuum sealant that is applied externally to the glass seal while a vacuum is applied to the delidded hybrid microcircuit header. Benefits are realized using the present invention through reduced scrap costs and preserved delivery schedules.

More particularly, the present process comprises the following steps. A leaking hybrid microcircuit is delidded so that its cover is removed. The delidded hybrid microcircuit is disposed on or coupled to a vacuum source outfitted with a helium detector. A vacuum is pulled or otherwise formed on the hybrid microcircuit using the vacuum source. A sealant is applied to each failed seal while the hybrid microcircuit is exposed to vacuum. The sealant comprises a silicone resin having a low vapor pressure. A stream of helium is flowed over the seals to verify the presence of leaks in the seals of the hybrid microcircuit header. A small amount of sealant is applied to each of the leaking glass-to-metal seals while the hybrid microcircuit header is exposed to the vacuum. The vacuum draws the sealant through cracked or defective glass-to-metal seals. A stream of helium is flowed over the repaired glass-to-metal seals following application of the high vacuum sealant to confirm that the hybrid microcircuit header is sealed. The hybrid microcircuit is removed from the vacuum source and cured at a temperature of 150±10 degrees Celsius for 2 hours minimum.

BRIEF DESCRIPTION OF THE DRAWINGS

The various features and advantages of the present invention may be more readily understood with reference to the following detailed description taken in conjunction with the accompanying drawing, wherein like reference numerals designate like structural elements, and in which.

DETAILED DESCRIPTION

Figure 1:
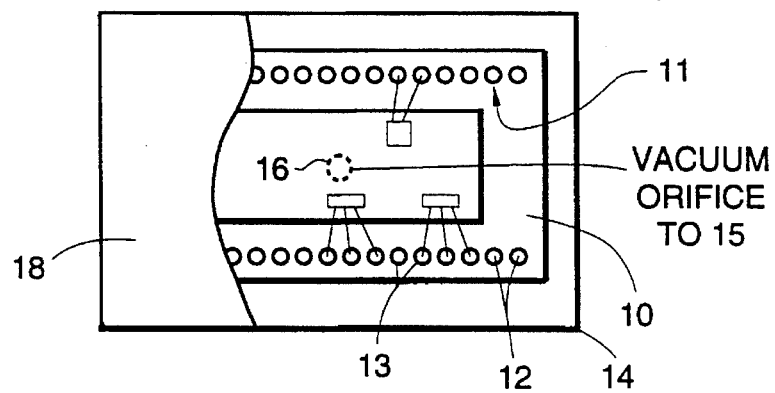
FIGS. 1 and 2 illustrate a hybrid microcircuit header repair process in accordance with the principles of the present invention.
Figure 2:
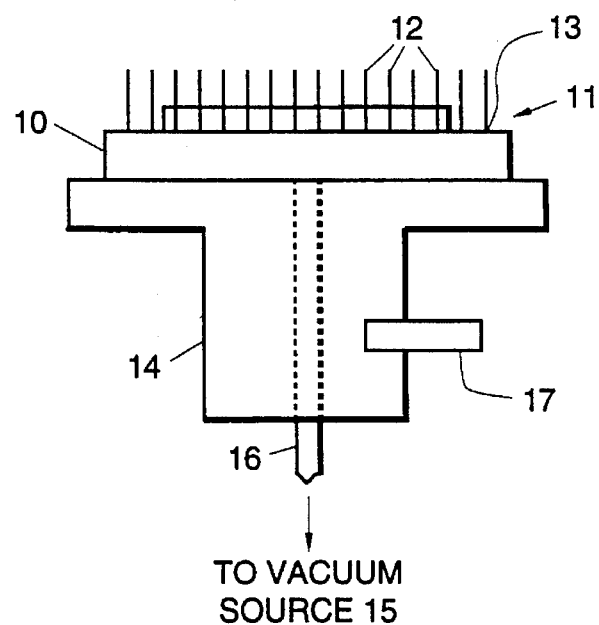

Referring to the drawing figure, FIGS. 1 and 2 illustrate top and side views of a hybrid microcircuit header 10 having leaking glass-to-metal seals 13 that are to be repaired using a repair or sealing process 20 or procedure 20 in accordance with the principles of the present invention. The hybrid microcircuit header 10 contains leaking glass-to-metal seals 13 that are repaired by the process 20.

Figure 1A:
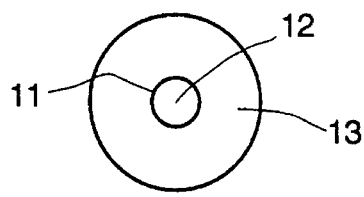
FIG. 1a illustrates an enlarged view of a glass-to-metal seal of the hybrid microcircuit header of FIGS. 1 and 2.

As is shown in FIG. 1, the hybrid microcircuit header 10 contains electrical leads 12 that extend from the surface thereof and which permit electrical connections to be made to the hybrid microcircuit header 10. Each of the leads 12 is surrounded and sealed at the surface of the hybrid microcircuit header 10 by means of a glass-to-metal seal 13 that is comprised of glass material, which is deposited and fired during the fabrication process. For the purposes of clarity, FIG. 1a illustrates an enlarged view of one glass-to-metal seal 13 of the hybrid microcircuit header 10.

The present sealing process 20 is designed to repair leaking glass-to-metal seals 13 that are uncovered during leak testing of the complete hybrid microcircuit package of which the hybrid microcircuit header 10 of FIG. 1 forms a part. As is shown in FIG. 2, in order to implement the present repair process 20, the hybrid microcircuit header 10, with its lid 18 removed, is attached to a platen 14 of a vacuum source 15, such as is provided by a Helium leak detector 17, for example. The platen 14 has one or more orifices 16 that permit a vacuum to be applied to the delidded hybrid microcircuit header 10.

The present sealing process 20 uses a high vacuum sealant 11, such as Vacseal™, for example, manufactured by Space Environment Laboratories. The Vacseal high vacuum sealant 11 is a silicone resin having a low vapor pressure.

Figure 3:
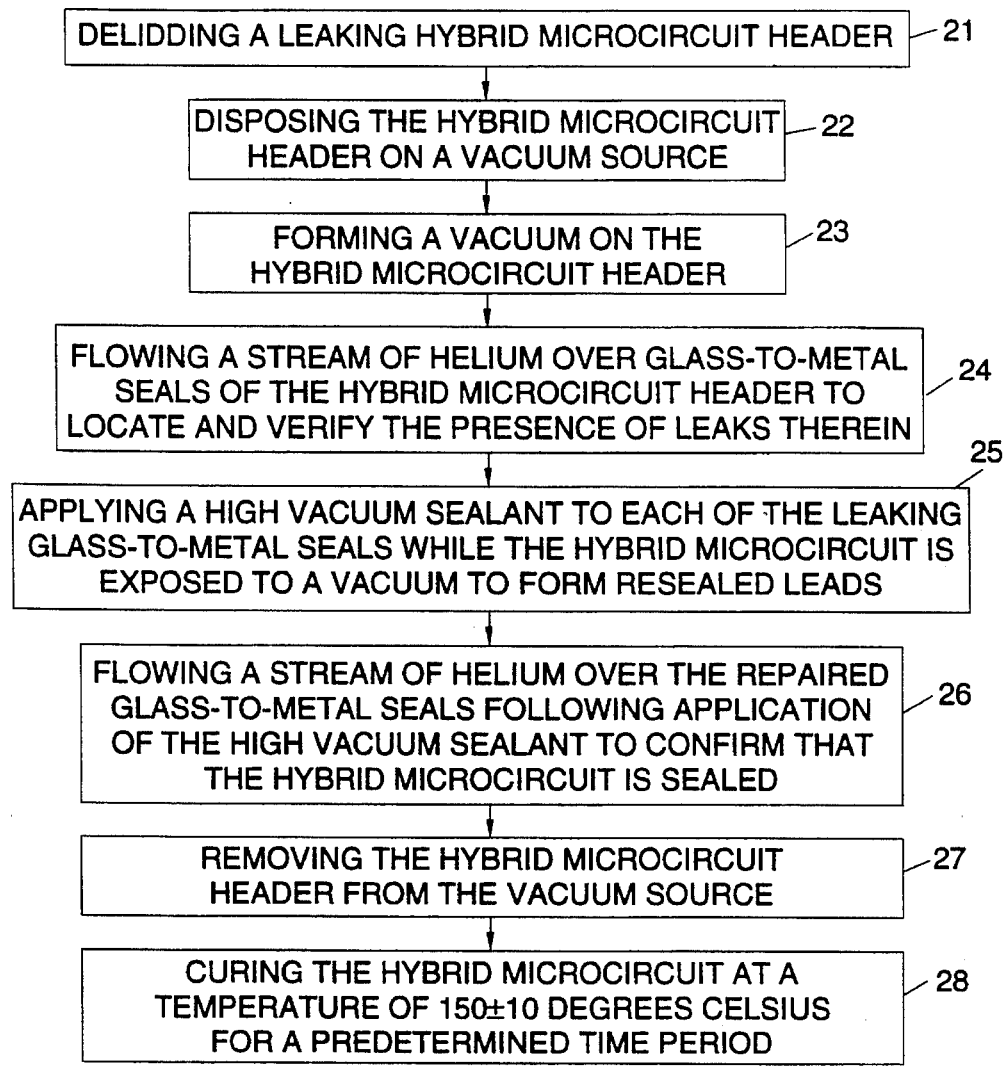
FIG. 3 is a detailed flow diagram illustrating the hybrid microcircuit header repair process in accordance with the principles of the present invention.

FIG. 3 is a flow diagram illustrating the repair process 20 in accordance with the principles of the present invention for repairing leaking glass-to-metal seal 13 of a hybrid microcircuit header 10. With reference to FIG. 3, the glass-to-metal seal 13 repair process 20 for repairing leaking hybrid microcircuit headers 10 comprises the following steps.

The failed hybrid microcircuit header 10 is first delidded 21 (its lid 18 or cover is removed) before performing the repair procedure. After delidding 21, the hybrid microcircuit header 10 is disposed 22, typically with its leads 12 pointing vertically, on a vacuum source 15. Then a vacuum is formed 23 on the hybrid microcircuit header 10 using the vacuum source 15, in the manner shown in FIG. 2. An open face helium leak detection system may be used as the vacuum source 15. A fine stream of helium is flowed 24 over the seals 13 to verify leaks in the seals 13 of the hybrid microcircuit header 10.

A small amount of high vacuum sealant 11 is then applied 25 to each leaking seal 13 while the hybrid microcircuit header 10 is exposed to the vacuum. The high vacuum sealant 11 may be applied 25 to each of the glass-to-metal seals 13 using a hypodermic syringe, for example. Following application of the high vacuum sealant 11, a stream of helium is flowed 26 over the leads 12 to confirm that the hybrid microcircuit header 10 is sealed.

The hybrid microcircuit header 10 is removed 27 from the vacuum source 15 and cured 28 in an oven at a temperature of 150±10 degrees C. (302 degrees Fahrenheit) for 2 hours minimum. Following curing 28, the hybrid microcircuit header 10 is retested 29 for leaks using the Helium and vacuum source 15. Once the reseated hybrid microcircuit header 10 has passed the open face leak tests, the hybrid microcircuit header 10 is processed and tested through the remaining assembly processes beginning with the seam seal process (reattachment of the lid 18 or cover).

Tests were performed on hybrid microcircuit headers 10 using the repair process 20 of the present invention and the following results were derived. Four hybrid microcircuit headers 10 exhibiting fine leaks were evaluated. Two of the four hybrid microcircuit headers 10 that were evaluated did not contain any fine leaks during open face leak testing. The hybrid microcircuit headers 10 were purposely made to leak by bending a lead 12 on each hybrid microcircuit header 10. The fine leak limit that was used is $5 \times 10^{-7}$ cc/sec/He. The four hybrid microcircuit headers 10 had leak rates as follows: $1 \times 10^{-6}$, $2 \times 10^{-6}$, $1 \times 10^{-6}$, and $5 \times 10^{-7}$.

Each hybrid microcircuit headers 10 was subjected to an open face leak test. Once the hybrid microcircuit headers 10 was stabilized at a constant leak rate, a small amount of sealant 11 was applied to each external glass-to-metal seal 13 surrounding the lead 12 with the hybrid microcircuit headers 10 under vacuum. The leak rates after the sealant 11 was applied are as follows: $4 \times 10^{-9}$, $4 \times 10^{-9}$, $1 \times 10^{-8}$, and $1 \times 10^{-9}$. Each hybrid microcircuit header 10 was cured at 150 degrees Celsius (302 degrees Fahrenheit) for 2 hours.

Following oven cure, the hybrids were once again leak tested. The leak test results after oven bake are as follows: $4 \times 10^{-9}$, $1 \times 10^{-9}$, $1 \times 10^{-8}$, $5 \times 10^{-9}$.

The hybrid microcircuit headers 10 were then subjected to temperature cycle testing. The test consisted of ten cycles at −65 degrees Celsius (−84 degrees Fahrenheit) to +150 degrees Celsius (+302 degrees Fahrenheit). The open face leak test results following temperature cycling are as follows: $3 \times 10^{-9}$, $1 \times 10^{-9}$, $1 \times 10^{-8}$, $5 \times 10^{-9}$. The hybrid microcircuit headers 10 were subjected to a second temperature cycle test using the identical test parameters, ten cycles −65 degrees Celsius (−84 degrees Fahrenheit) to 150 degrees Celsius (+302 degrees Fahrenheit). The open face leak test results following the second temperature cycling are as follows: $3 \times 10^{-9}$, $1 \times 10^{-9}$, $1 \times 10^{-8}$, $5 \times 10^{-9}$.

Following temperature cycling the hybrid microcircuit headers 10 were subjected to a pretinning operation to determine if molten solder temperatures would degrade the repaired seal 13. A solder pot was maintained at 260 degrees Celsius (500 degrees Fahrenheit). Each lead 12 was fluxed using water soluble flux paste, held in the molten solder wave for a period of 5 seconds and cleaned using in-line aqueous cleaning. The open face leak test results following the pretinning steps are as follows: $4 \times 10^{-9}$, $4 \times 10^{-9}$, $2 \times 10^{-8}$, $4 \times 10^{-9}$.

The hybrid microcircuit headers 10 were subjected to an acceleration test at 5000 g's for 1 minute. Following acceleration the hybrid microcircuit headers 10 were once again open face leak tested. Test results are as follows: $7 \times 10^{-9}$, $1 \times 10^{-8}$, $1 \times 10^{-8}$, $1 \times 10^{-8}$. The apparent shifts in the Helium leak rate are within normal machine accuracy and were not considered to be actual shifts in performance.

Chemical analysis using Fourier Transform Infrared Spectroscopy (FTIR) and Gas Chromatography Mass Spectrometry (GGMS) was performed on a sample of the sealant 11. Results of the analysis indicate that the sealant 11 consists of a solution of silicone oil in a mixture of volatile organic solvents. The principle solvents identified were 1,1,1 Trichloroethane, toluene, and the 2-methylpropyl ester of butanoic acid. A small amount of 1,4-dioxane (used as a stabilizer for the 1,1,1 trichloroethane), xylene and aliphatic hydrocarbons were present. The chemical analysis determined that the constituents of the sealant 11 are not corrosive or otherwise detrimental to circuitry contained in hybrid microcircuit headers 10.

Figure 4:
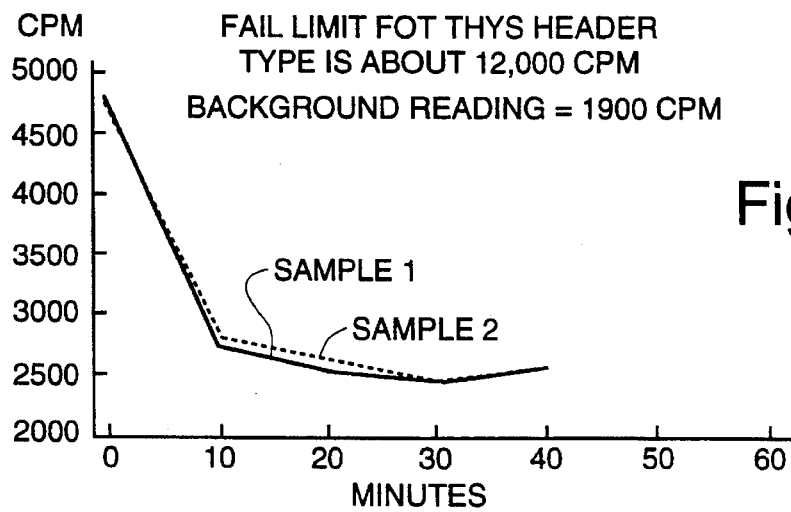
FIG. 4 illustrates a radioactive decay test plot for hybrid microcircuit headers repaired using the present repair process.

Leak detection using Krypton gas was performed on one of the hybrid microcircuit headers 10 to determine the absorption rate of the radioactive gas into the sealant 11. Results of the test indicate that the counts per minute are well below desired limits, as is indicated in the radioactive decay test plot of FIG. 4.

An additional test was conducted to determine how well the repaired seals 13 hold up when immersed in water. The test in accordance with MIL-STD-883 Method 1002, Test condition A was applied to the hybrid microcircuit headers 10. Test condition A requires the tested component to be immersed into hot and cold tap water. The test is performed for two cycles with a duration of fifteen minutes per cycle. The cold immersion bath is maintained at 25 degrees Celsius (75 degrees Fahrenheit) and the hot immersion bath at 65 degrees Celsius (150 degrees Fahrenheit). Following the completion of the immersion test, the hybrids were subjected to Krypton leak testing. The hybrid microcircuit headers 10 passed the Krypton leak test. The Krypton leak test results are recorded as a pass or fail. After the leak test was complete, the hybrid microcircuit headers 10 were delidded and inspected for the presence of internal moisture using 30× magnification. No moisture intrusion was noted.

Thus there has been described a new and improved glass-to-metal seal repair process for use in repairing hybrid microcircuits exhibiting leaking glass-to-metal seals. It is to be understood that the above-described embodiment is merely illustrative of some of the many specific embodiments that represent applications of the principles of the present invention. Clearly, numerous and other arrangements can be readily devised by those skilled in the art without departing from the scope of the invention.

What is claimed is:

1. A process for repairing leaking glass-to-metal seals of a hybrid microcircuit header comprising the steps of:

delidding a leaking hybrid microcircuit header;

disposing the hybrid microcircuit header on a vacuum source;

forming a vacuum on the hybrid microcircuit header;

flowing a stream of helium over the seals to verify the presence and location of leaks in the seals of the hybrid microcircuit header;

applying a high vacuum sealant formed of a silicone resin having a low vapor pressure to each of the leaking glass-to-metal seals while the hybrid microcircuit header is exposed to a vacuum to form resealed leads;

flowing a stream of helium over the resealed leads following application of the high vacuum sealant to confirm that the hybrid microcircuit header is sealed;

removing the hybrid microcircuit header from the vacuum source; and curing the hybrid microcircuit header at a temperature of 150± degrees Celsius to create a permanent seal.

2. The process of claim 1 wherein the curing step lasts a minimum of 2 hours.

3. The process of claim 1 wherein the vacuum source comprises an open face helium leak detection system.

4. The process of claim 1 wherein the step of applying the high vacuum sealant to the leaking seals comprises applying the sealant using a hypodermic syringe.

5. The process of claim 1 wherein the step of curing the hybrid microcircuit header comprises curing the hybrid microcircuit header in an oven.

6. The process of claim 1 wherein the step of disposing the hybrid microcircuit header on a vacuum source comprises the step of disposing the hybrid microcircuit header with its leads pointing upward on the vacuum source.

7. The process of claim 1 further comprising the step of retesting the hybrid microcircuit header for leaks using the Helium and vacuum source after it is cured.

* * * * *